United States Patent
Shizuno et al.

(10) Patent No.: US 7,354,642 B2
(45) Date of Patent: Apr. 8, 2008

(54) MULTILAYER DISPLACEMENT ELEMENT

(75) Inventors: Hisamitsu Shizuno, Tokyo (JP);
Hirokazu Chazono, Tokyo (JP);
Hiroshi Kishi, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 243 days.

(21) Appl. No.: 10/891,070

(22) Filed: Jul. 15, 2004

(65) Prior Publication Data

US 2004/0262037 A1 Dec. 30, 2004

Related U.S. Application Data

(63) Continuation-in-part of application No. 09/784,999, filed on Feb. 15, 2001, now abandoned.

(30) Foreign Application Priority Data

Feb. 16, 2000 (JP) .............................. 2000-037540

(51) Int. Cl.
*B23B 18/00* (2006.01)
(52) U.S. Cl. ................... 428/325; 361/321; 361/321.2; 29/25.41; 29/25.42
(58) Field of Classification Search ................ 428/325, 428/900, 471; 361/311, 312, 313, 306.3, 361/305, 321.2, 321.3, 321.4; 29/25.41, 29/25.42, 830, 609, 846, 831
See application file for complete search history.

(56) References Cited

U.S. PATENT DOCUMENTS

| | | | | | |
|---|---|---|---|---|---|
| 3,872,360 | A | * | 3/1975 | Sheard | .................. 361/305 |
| 4,283,753 | A | * | 8/1981 | Burn | .................. 361/321.4 |
| 5,010,443 | A | * | 4/1991 | Maher | .................. 361/321.4 |
| 5,680,685 | A | * | 10/1997 | Bischoff | .................. 29/25.42 |

FOREIGN PATENT DOCUMENTS

DE 3833073 * 4/1990

* cited by examiner

*Primary Examiner*—A. Dexter Tugbang
(74) *Attorney, Agent, or Firm*—Bacon & Thomas PLLC

(57) ABSTRACT

A multilayer displacement element is formed by alternately stacking a plurality of ceramic layers and a multiplicity of internal electrodes, wherein each of the ceramic layers is composed of ceramic grains containing barium titanate as a main component and each of the internal electrodes is a metallic film with a mesh shape. The meshed shape of metallic films leads to a reduced contact area between the metallic films and the ceramic layers. Therefore, the displacement of the ceramic layers can be less restricted by the metallic films and thus the amount of displacement of the ceramic layers can be increased. The ceramic grains preferably have an average diameter equal to or larger than 3.5 μm and it is desirable that the ratio of one grain to one layer for the ceramic layer be equal to or larger than 20%.

9 Claims, 3 Drawing Sheets

MULTILAYER DISPLACEMENT ELEMENT

CROSS REFERENCE TO RELATED APPLICATION

This application is a continuation-in-part application of U.S. application Ser. No. 09/784,999 filed on Feb. 15, 2001 now abandoned.

FIELD OF THE INVENTION

The present invention relates to a multilayer displacement element capable of displacing a ceramic layer sandwiched between two adjacent internal electrodes in a stacking direction by varying electric field intensity induced between the internal electrodes, wherein a displacement property of the ceramic layer can be used in driving a micro position determination device.

DESCRIPTION OF THE PRIOR ART

Referring to FIG. 1, there is illustrated a cross sectional view of a multilayer displacement element. The multilayer displacement element, as shown in FIG. 1, includes a laminated body 10 having alternately stacked ceramic layers 14 and internal electrodes 16, and a pair of external electrodes 12A and 12B respectively disposed at two opposite end portions of the laminated body 10. Among the internal electrodes 16, a pair of two adjacent internal electrodes faces each other through the ceramic layer disposed therebetween and one of them is electrically connected to the external electrode 12A and the other to the external electrode 12B.

The ceramic layers 14 are composed of, as a main component, a ceramic material having a highly electrostrictive property such as lead titanate zirconate and the internal electrodes 16 are formed by sintering a conductive paste containing as a principal component a noble metallic material such as Ag—Pd powder.

An exemplary method for manufacturing the multiplayer displacement element will now be described.

First, ceramic slurry is obtained by mixing ceramic powder containing as a main component the lead titanate zirconate, an organic binder and an organic solvent. Then a ceramic green sheet is formed in a film type from the ceramic slurry through the use of, e.g., a doctor blade technique.

Subsequently, an internal electrode pattern is printed on the ceramic green sheet by applying an electrically conductive paste containing therein Ag—Pd powder as a major component thereof. Next, a laminated ceramic green body is obtained by stacking and pressing the ceramic green sheets provided with the conductive paste printed thereon. The laminated ceramic green body is diced into a predetermined size to thereby produce laminated chips. The laminated chips are heated to remove the organic binder and the organic solvent contained therein and sintered at a temperature ranging approximately from 1200 to 1300° C. Finally, external electrodes are formed at both ends of each sintered body so that the multilayer displacement element is obtained.

Since the multilayer displacement element has properties of a large electrostriction and a fast response, it has been used as a micro position determination device or a driving source for a printer header, a positioner, a relay, a hard disc, a semiconductor exposure device, a fluid control valve, or the like.

However, the conventional multilayer displacement element uses a compound containing a substantial amount of Pb such as the lead titanate zirconate as a ceramic material and, therefore, may entail an environmental problem when electronic devices having the multilayer displacement devices therein are scrapped.

SUMMARY OF THE INVENTION

It is, therefore, a primary object of the present invention to provide a multilayer displacement element composed of ceramic layers that are formed by using compounds whose amount of displacement is large and which do not include Pb therein, and a method for manufacturing the multilayer displacement element.

In accordance with one aspect of the present invention, there is provided a multilayer displacement element having alternately stacked ceramic layers and internal electrodes, wherein each of the ceramic layers contains barium titanate as a main component and each of the internal electrodes is a metallic film having a mesh shape.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
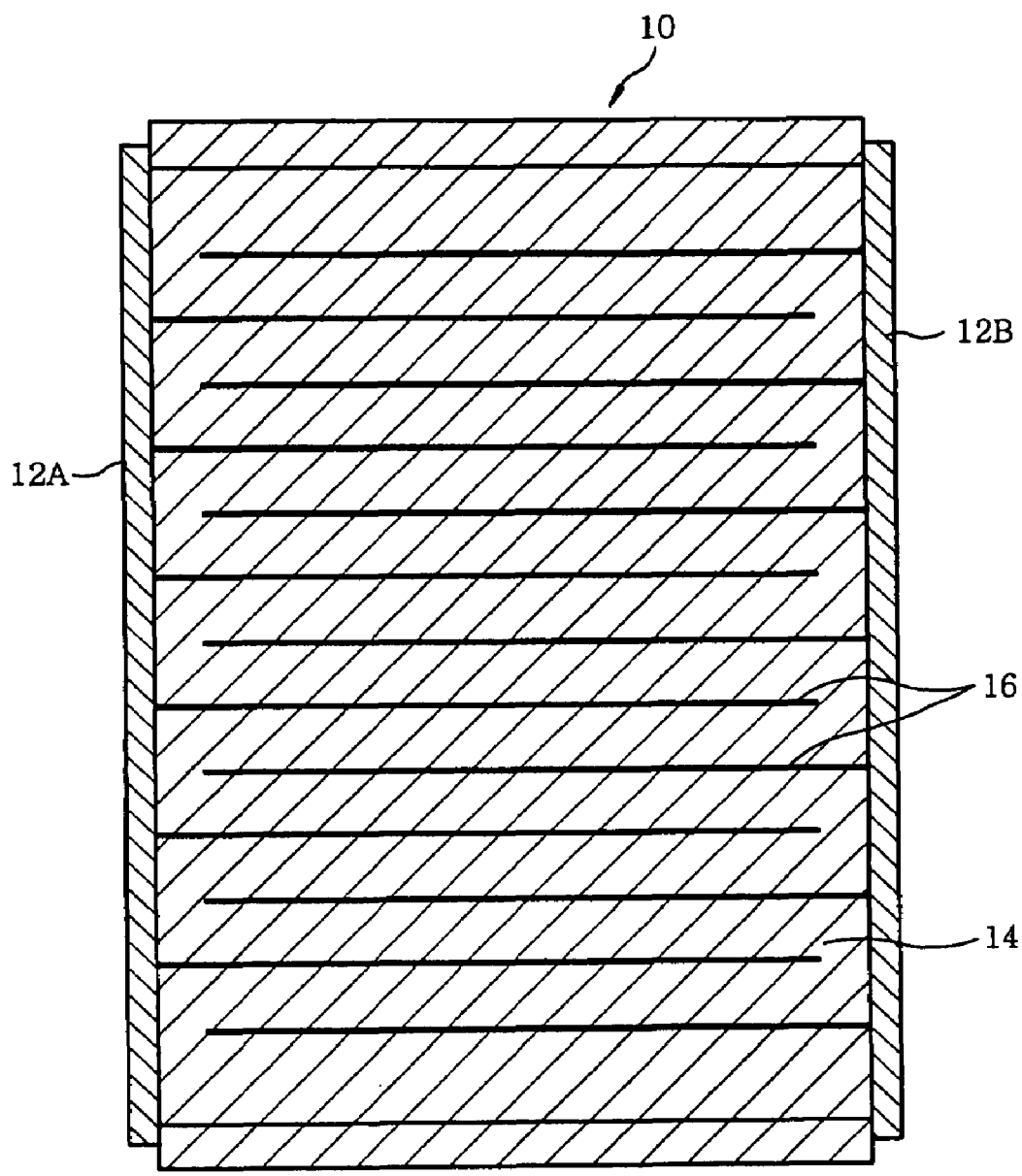
FIG. 1 illustrates a cross sectional view of a typical multilayer displacement element.

The multilayer displacement element in accordance with the present invention includes alternately stacked ceramic layers and internal electrodes, wherein the ceramic layers are made of ceramic grains whose main component is barium titanate and each of the internal electrodes is a metallic film with a mesh shape. The meshed shape of metallic films leads to a reduced contact area between the metallic films and the ceramic layers. Therefore, the displacement of the ceramic layers can be less restricted by the metallic films and thus the amount of displacement of the ceramic layers can be increased.

In the present invention, it is preferable that an average diameter of the ceramic grains be equal to or larger than 3.5 μm since it is difficult to get a desired amount of displacement when the average diameter is less than 3.5 μm.

Further, it is desirable that a ratio of one grain to one layer for the ceramic layer be equal to or larger than 20% and, more preferably, 30% or higher, when a cross sectional surface of the ceramic layer is observed in a two dimensional plane. If the ratio is less than 20%, it is difficult to obtain the desired amount of displacement. As used herein, the ratio of one grain to one layer represents the ratio of portions where one grain constitutes one layer to the entire area of the ceramic layer.

The ratio of one grain to one layer can be determined, for instance, as follows. First, the multilayer displacement element is cut in a direction normal to a surface of the internal electrode. Then, diameters of ceramic grains exposed on a cross sectional surface of the ceramic layer are measured and, thereafter, an average of the diameters is computed. Subsequently, a predetermined number of vertical lines are assigned to the cross sectional surface to be normal to the surface of the internal electrode and the number of vertical lines on which only one ceramic grain is located is counted. Finally, the ratio of the counted number of vertical lines to the predetermined number of vertical lines is determined as the ratio of one grain to one layer.

Meanwhile, the ceramic layers can be obtained from a dielectric material having a B or F property and the internal electrodes can be made of a metallic material, e.g., Pt, Pd, Ag—Pd or a combination thereof, in addition to the sintered conductive paste containing Ni powder as a main component thereof.

The inventive multilayer displacement element is produced according to the following processes.

A ceramic green sheet is formed by using electrostrictive ceramic powder containing the barium titanate as a main component, wherein it is preferable that the thickness of the ceramic green sheet be equal to or less than 9 μm.

Then, a multiplicity of internal electrode patterns formed by an electrically conductive paste and a plurality of ceramic green sheets are alternately stacked to produce a laminated ceramic green body. Each of the internal electrode patterns is a metallic film having a mesh shape. The laminated ceramic green body is sintered at a temperature within a range between about 1000 and 1400° C. for a period from about 0.5 to 20 hours. Then, a pair of external electrodes is formed at both ends of the sintered laminated ceramic green body so that the multilayer displacement element is generated.

In the above sintering process, if the sintering duration is less than 0.5 hour at 1400° C. or less than 20 hours at 1000° C., it is difficult to obtain a desired average diameter of ceramic grains. Further, although the sintering duration is made longer than 20 hours when the sintering temperature is 1400° C., an average diameter of the ceramic grains does not exceed the thickness of the ceramic green sheet. For these reasons, the ranges of the sintering temperature and duration are determined as described above.

Hereinafter, an exemplary process of manufacturing the multilayer displacement element will be shown in detail.

First, slurry is obtained by weighing ceramic powder containing as a main component the barium titanate and sufficiently wet-mixing the weighted ceramic powder with an organic binder and water by using a ball mill, wherein the ceramic powder includes a dielectric ceramic compound having a B or F property.

After removing air contained in the slurry, a ceramic green sheet is formed from the slurry to have a thickness of 9 μm through the use of a doctor blade technique.

Subsequently, internal electrode patterns are screen-printed by applying an electrically conductive paste whose main component is Ni powder onto the ceramic green sheet so that a pattern-printed sheet is generated. Each of the internal electrode patterns is a metallic film with a mesh shape.

Next, a laminated ceramic green body is obtained by stacking, e.g., 10 number of pattern-printed sheets to thereby produce a stacked body, attaching the ceramic green sheet onto each of upper and lower sides of the stacked body and, in turn, pressing the resulting product in a stacking direction.

Laminated chips are obtained by dicing the laminated ceramic green body in a predetermined size.

Figure 4:
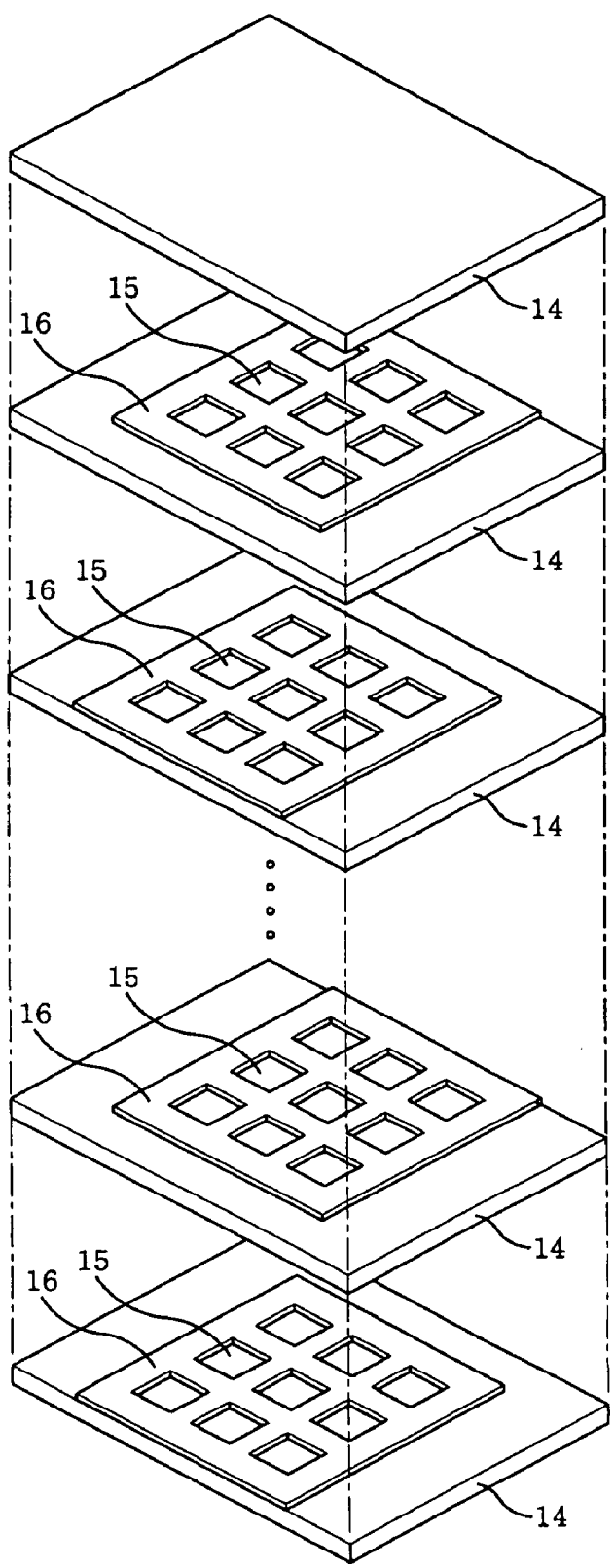
FIG. 4 represents a part of an exploded perspective view of a laminated chip showing exemplary meshed internal electrode patterns.

Referring to FIG. 4, there is shown an exploded perspective view of a laminated chip showing, e.g., 4 number of pattern-printed sheets. Each pattern-printed sheet has a ceramic green sheet 14 and an internal electrode pattern 16 screen-printed onto the ceramic green sheet 14. The internal electrode pattern 16 is a metallic film having a mesh shape. In other words, each internal electrode pattern 16 has a plurality of disjointed openings 15 disposed regularly or randomly in the internal electrode pattern 16. Between the openings 15 there exists a continuous metallic portion. Each opening 15 can have any shape, for example, a circular or a square shape. Further, the openings 15 need not have the same size and shape. The ratio of the area occupied by the openings 15 in each internal electrode pattern 16 can be determined as desired.

In order to remove the organic binder and water contained therein, the laminated chip is heated up to 600° C. in an atmosphere. Then, the heated laminated chip is sintered at a temperature within a range from 1200 to 1300° C. for 1 to 5 hours in a non-oxidizing atmosphere composed of a nitride gas including 2.0 vol % of $H_2$. Herein, an average diameter of ceramic grains constituting the ceramic layer can be adjusted by the sintering temperature and time.

Then, the sintered laminated chip is heated again at a temperature of 600° C. for one hour in a nitride atmosphere containing 200 ppm of oxygen to thereby produce a re-oxidized laminated chip, which is then cooled down to a room temperature.

Finally, a multilayer displacement element is obtained by forming external electrodes at both ends of the re-oxidized laminated chip through a heating process.

Referring to the following Table 1, there are shown results of measured amounts of displacements of various multilayer displacement elements along the stacking direction when DC 100 V is applied to the multilayer displacement elements positioned in a thermostat of 20° C.

Figure 2:
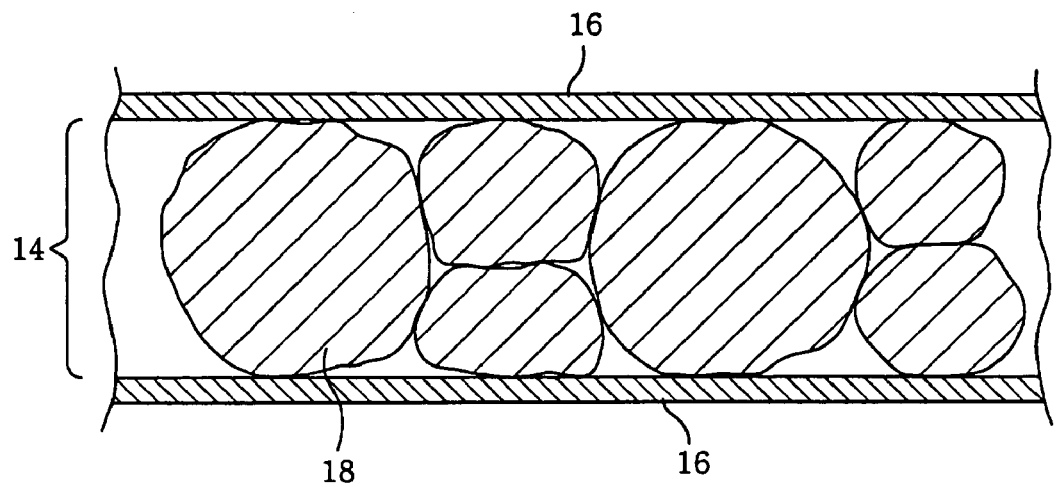
FIG. 2 is a partial cross sectional view of a ceramic layer of a multilayer displacement element in accordance with a preferred embodiment of the present invention (identified as specimen No. 3 herein)
Figure 3:
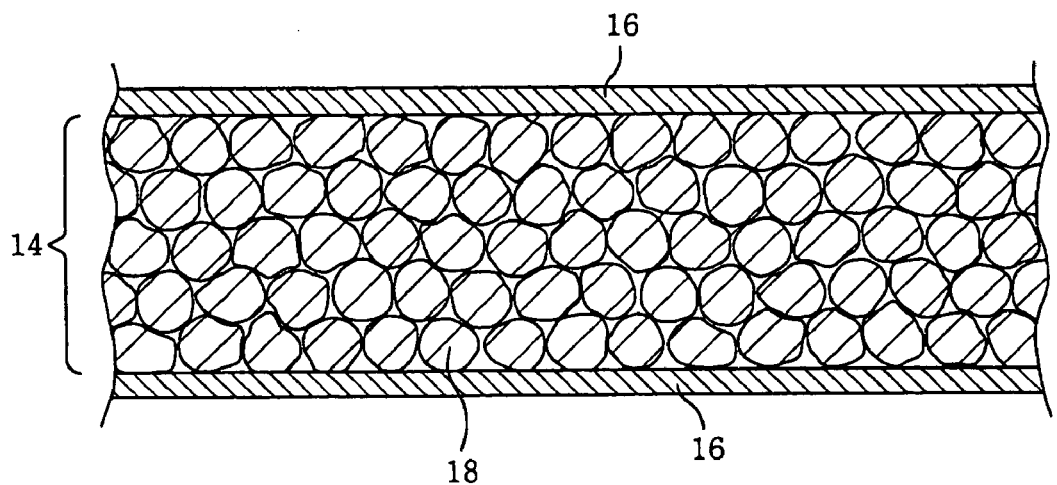
FIG. 3 describes a partial cross sectional view of a ceramic layer of a multilayer displacement element identified as specimen No. 1 herein.

In FIGS. 2 and 3, there are illustrated ceramic grains of specimen Nos. 3 and 1 described in Table 1, respectively. The ceramic grains are observed by cutting the multilayer displacement element in a direction normal to a surface of the internal electrode, polishing a cut plane, heat-etching a polished cut plane and photographing an etched plane by using a scanning electron microscope (SEM) with a magnifying power of 2000.

Specifically, FIG. 2 shows ceramic grains constituting a ceramic layer of a multilayer displacement element in accordance with a preferred embodiment of the present invention, whereas FIG. 3 describes ceramic grains constituting a ceramic layer of a multilayer displacement element in accordance with a comparative example. In FIGS. 2 and 3, the ceramic layer 14 sandwiched by internal electrodes 16 is composed of a plurality of ceramic grains 18.

For each of specimen Nos. 1 to 6, diameters of 200 number of ceramic grains are measured along a line parallel to the surface of the internal electrode and then an average of the measured diameters is obtained. The average diameter for each of specimen Nos. 1 to 6 is described in Table 1.

Next, in order to compute the ratio of one grain to one layer, first, 100 lines normal to the surface of the internal electrode are drawn on a SEM picture of each of specimen Nos.1 to 6, wherein an interval of two adjacent lines is identical to the average diameter obtained above, and, among the lines, those lines each of which contains only one grain thereon are counted. Then, the ratio of the counted number to the total number of lines is determined as the ratio of one grain to one layer. In Table 1, there is shown the ratio of one grain to one layer for each specimen.

TABLE 1

| SPECIMEN NUMBER | AVERAGE DIAMETER OF CERAMIC GRAINS (μm) | RATIO OF ONE GRAIN TO ONE LAYER (%) | AMOUNT OF DIS- PLACEMENT (μm) | PROPERTY OF CERAMIC MATERIAL |
| --- | --- | --- | --- | --- |
| 1 | 3.0 | 15 | 3 | F |
| 2 | 3.5 | 20 | 5 | F |
| 3 | 4.0 | 25 | 7 | F |
| 4 | 4.0 | 25 | 7 | B |
| 5 | 5.0 | 30 | 10 | F |
| 6 | 7.0 | 40 | 10 | F |

As illustrated in Table 1, it is possible to increment the amount of displacement due to electrostriction by increasing the ratio of one grain to one layer for the ceramic grains constituting the ceramic layer and, as a result, the amount of displacement of the multilayer displacement element can be also augmented. Further, as can be seen from the results for specimen Nos. 3 and 4, the same results can be obtained without regard to the material property of the ceramic layer, e.g., B or F.

Since the multilayer displacement element in accordance with the present invention uses a compound containing a substantial amount of barium titanate instead of Pb as a ceramic material, it can improve the working environment in manufacturing multilayer displacement elements, thereby avoiding an environmental pollution caused by Pb.

Moreover, since it is determined that the ratio of one grain to one layer is larger than 20% of the entire area of a ceramic layer when ceramic grains positioned on a cross sectional surface of the ceramic layer are observed in a two dimensional plane, a small-sized multilayer displacement element having a desired amount of displacement can be obtained.

Moreover, the meshed shape of metallic films leads to a reduced contact area between the metallic films and the ceramic layers. Therefore, the displacement of the ceramic layers can be less restricted by the metallic films and thus the amount of displacement of the ceramic layers can be increased.

While the present invention has been described with respect to the particular embodiments, it will be apparent to those skilled in the art that various changes and modifications may be made without departing from the spirit and scope of the invention as defined in the following claims.

What is claimed is:

1. A multilayer displacement element formed by alternately stacking a plurality of ceramic layers and a multiplicity of internal electrodes, wherein each of the ceramic layers is composed of ceramic grains containing barium titanate as a major component and each of the internal electrodes is a metallic film having a mesh shape, wherein in a cross section of one ceramic layer cut parallel to a direction of stacking the ceramic layers and the internal electrodes, a sum of areas of portions where a single ceramic grain constitutes said one ceramic layer is equal to or larger than 30% of an entire area of said one ceramic layer, and wherein the ceramic layers are displaced in the direction of stacking the ceramic layers and the internal electrodes by varying electric field intensity induced between the internal electrodes.

2. The multilayer displacement element as recited in claim 1, wherein the ceramic grains constituting said each of the ceramic layers have an average diameter equal to or larger than 3.5 μm.

3. The multilayer displacement element as recited in claim 2, wherein the internal electrodes are produced by sintering a conductive paste containing Ni powder as a main component.

4. The multilayer displacement element as claimed in claim 2, wherein the internal electrodes are obtained by sintering a conductive paste containing Ni powder as a major component.

5. The multilayer displacement element as recited in claim 1, wherein the internal electrodes are obtained by sintering a conductive paste containing Ni powder as a major component.

6. The multilayer displacement element as recited in claim 1, wherein the ceramic grains constituting said each of the ceramic layers have an average diameter equal to or larger than 3.5 μm and equal to or smaller than 7 μm.

7. The multilayer displacement element as claimed in claim 6, wherein the internal electrodes are obtained by sintering a conductive paste containing Ni powder as a major component.

8. The multilayer displacement element as claimed in claim 6, wherein a displacement range of the multilayer displacement element is from 5 to 10 μm.

9. The multilayer displacement element as claimed in claim 1, wherein a displacement range of the multilayer displacement element is from 5 to 10 μm.

* * * * *